United States Patent
Choi et al.

(10) Patent No.: US 10,854,764 B2
(45) Date of Patent: Dec. 1, 2020

(54) SOLAR CELL AND METHOD FOR MANUFACTURING THE SAME

(71) Applicant: LG Electronics Inc., Seoul (KR)

(72) Inventors: Minho Choi, Seoul (KR); Hyunjung Park, Seoul (KR); Junghoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/258,638

(22) Filed: Apr. 22, 2014

(65) Prior Publication Data
US 2014/0311567 A1  Oct. 23, 2014

(30) Foreign Application Priority Data

Apr. 23, 2013  (KR) .................. 10-2013-0044982

(51) Int. Cl.
*H01L 31/0216* (2014.01)
*H01L 31/0745* (2012.01)
(Continued)

(52) U.S. Cl.
CPC .............. *H01L 31/02167* (2013.01); *H01L 31/022441* (2013.01); *H01L 31/072* (2013.01); *H01L 31/0745* (2013.01); *H01L 31/0747* (2013.01); *H01L 31/1804* (2013.01); *Y02E 10/547* (2013.01); *Y02P 70/521* (2015.11)

(58) Field of Classification Search
CPC . H01L 31/028; H01L 31/0284; H01L 31/068; H01L 31/0682; H01L 31/02241; H01L 31/022425; H01L 31/0747; H01L 31/02245; H01L 31/022441–022458; H01L 31/1804; H01L 31/182; H01L 31/1824

See application file for complete search history.

(56) References Cited

U.S. PATENT DOCUMENTS 4,315,097 A  *  2/1982  Solomon ................. 136/255
5,057,439 A  * 10/1991  Swanson et al. ........ 136/256
(Continued)

FOREIGN PATENT DOCUMENTS

WO  2012/074602 A1   6/2012
WO  2012163517 A2  12/2012

OTHER PUBLICATIONS

Kluska, et al. "Modeling and optimization study of industrial n-type high-efficiency back-contact back-junction silicon solar cells." Solar Energy Materials and Solar Cells 94.3 (2010): 568-577.*
(Continued)

*Primary Examiner* — William E McClain
(74) *Attorney, Agent, or Firm* — Dentons US LLP

(57) ABSTRACT

A solar cell includes a semiconductor substrate, a tunneling layer on one surface of the semiconductor substrate, a first conductive type area on the tunneling layer, a second conductive type area on the tunneling layer such that the second conductive type area is separated from the first conductive type area, and a barrier area interposed between the first conductive type area and the second conductive type area such that the barrier area separates the first conductive type area from the second conductive type area.

3 Claims, 9 Drawing Sheets

(51) Int. Cl.
*H01L 31/18* (2006.01)
*H01L 31/0747* (2012.01)
*H01L 31/072* (2012.01)
*H01L 31/0224* (2006.01)

(56) References Cited

U.S. PATENT DOCUMENTS

| | | | |
|---|---|---|---|
| 7,468,485 B1* | 12/2008 | Swanson | H01L 31/03682 136/243 |
| 2006/0130891 A1* | 6/2006 | Carlson | 136/256 |
| 2008/0017243 A1* | 1/2008 | De Ceuster et al. | 136/255 |
| 2009/0293948 A1* | 12/2009 | Tucci | H01L 31/02168 136/256 |
| 2009/0308438 A1 | 12/2009 | De Ceuster et al. | |
| 2009/0314341 A1* | 12/2009 | Borden | H01L 31/022441 136/256 |
| 2010/0015756 A1* | 1/2010 | Weidman et al. | 438/96 |
| 2010/0055822 A1* | 3/2010 | Weidman et al. | 438/57 |
| 2010/0081264 A1* | 4/2010 | Leung | H01L 21/228 438/548 |
| 2010/0084009 A1* | 4/2010 | Carlson et al. | 136/255 |
| 2010/0139764 A1* | 6/2010 | Smith | H01L 31/182 136/256 |
| 2010/0193027 A1* | 8/2010 | Ji | H01L 31/02168 136/256 |
| 2010/0197126 A1* | 8/2010 | Bateman | H01J 37/32412 438/527 |
| 2010/0229917 A1* | 9/2010 | Choi | H01L 31/022441 136/244 |
| 2010/0229928 A1* | 9/2010 | Zuniga | H01L 31/1804 136/255 |
| 2011/0027463 A1* | 2/2011 | Riordon | H01J 37/20 427/75 |
| 2011/0056550 A1* | 3/2011 | Choi | H01L 31/02167 136/256 |
| 2011/0073175 A1* | 3/2011 | Hilali | H01L 31/022441 136/256 |
| 2011/0120530 A1* | 5/2011 | Isaka | B32B 17/10018 136/251 |
| 2011/0126898 A1* | 6/2011 | Harley | H01L 31/0682 136/256 |
| 2012/0138135 A1 | 6/2012 | Manning | |
| 2012/0156592 A1* | 6/2012 | Bateman | H01L 31/022441 430/5 |
| 2012/0167978 A1* | 7/2012 | Shin | H01L 31/022441 136/256 |
| 2012/0190183 A1* | 7/2012 | Ricci | C23C 14/042 438/527 |
| 2012/0199183 A1* | 8/2012 | Oh | H01L 31/02167 136/252 |
| 2012/0247560 A1 | 10/2012 | Rim et al. | |
| 2012/0322199 A1 | 12/2012 | Graff | |
| 2013/0008494 A1* | 1/2013 | Bateman | H01L 21/26586 136/255 |
| 2014/0096819 A1* | 4/2014 | Kirkengen | H01L 31/022441 136/255 |
| 2014/0170800 A1* | 6/2014 | Loscutoff | H01L 31/18 438/72 |
| 2014/0295613 A1* | 10/2014 | O'Sullivan | H01L 31/0443 438/87 |

OTHER PUBLICATIONS

Galbiati, et al. "Results on n-type IBC solar cells using industrial optimized techniques in the fabrication processing." Energy Procedia 8 (2011): 421-426.*

Lu, et al. "Optimization of interdigitated back contact silicon heterojunction solar cells: tailoring hetero-interface band structures while maintaining surface passivation." Progress in Photovoltaics: Research and Applications 19.3 (2011): 326-338.*

Reichel, et al. "Back-contacted back-junction n-type silicon solar cells featuring an insulating thin film for decoupling charge carrier collection and metallization geometry." Progress in Photovoltaics: Research and Applications 21.5 (2013): 1063-1076.*

Renshaw, et al. "Device optimization for screen printed interdigitated back contact solar cells." Photovoltaic Specialists Conference (PVSC), 2011 37th IEEE. IEEE, 2011.*

Mario Tucci et al: "Back Enhanced Heterostructure with InterDigitated contact—BEHIND—solar cell" Optoelectronic and Microelectronic Materials and Devices, 2008, IEEE, Piscataway, NJ, USA, Jul. 28, 2008, pp. 242-245.

* cited by examiner

US 10,854,764 B2

SOLAR CELL AND METHOD FOR MANUFACTURING THE SAME

CROSS-REFERENCE TO RELATED APPLICATION

This application claims the priority benefit of Korean Patent Application No. 10-2013-0044982, filed on Apr. 23, 2013 in the Korean Intellectual Property Office, the disclosure of which is incorporated herein by reference.

BACKGROUND

1. Field of the Disclosure

The present disclosure relates to a solar cell and a method for manufacturing the same and, more particularly, to a solar cell having an improved structure and a method for manufacturing the same.

2. Background

In recent years, as conventional energy resources such as petroleum and coal are expected to be depleted, interest in alternative energy replacing these energy resources is on the rise. Of these, solar cells are attracting considerable attention as next generation cells which convert solar energy into electrical energy.

Such a solar cell may be manufactured by forming various layers and electrodes according to design. Solar cell efficiency may be determined according to design of various layers and electrodes. Low efficiency should be overcome in order to commercialize solar cells. Various layers and electrodes should be designed so that efficiency of solar cells can be maximized.

SUMMARY

One object is to provide a solar cell which is capable of improving reliability and maximizing efficiency.

In accordance with one aspect, the above and other objects may be accomplished by the provision of a solar cell including a semiconductor substrate, a tunneling layer on one surface of the semiconductor substrate, a first conductive type area on the tunneling layer, a second conductive type area on the tunneling layer such that the second conductive type area is separated from the first conductive type area, and a barrier area interposed between the first conductive type area and the second conductive type area such that the barrier area separates the first conductive type area from the second conductive type area.

In accordance with another aspect, a method for manufacturing a solar cell includes forming a tunneling layer on one surface of a semiconductor substrate, forming a semiconductor layer on the tunneling layer, and doping the semiconductor layer with a first conductive type dopant and a second conductive type dopant to form a first conductive type area and a second conductive type area separated from each other via a barrier area.

The solar cell according to the present embodiment includes the barrier area interposed between the first conductive type area and the second conductive type area disposed on one surface (for example, back surface) of the semiconductor substrate. As a result, shunt caused by undesired short between the first conductive type area and the second conductive type area can be prevented. In addition, the barrier area prevents connection between the first and second conductive type areas to undesired impurity layers, when alignment of the first and second electrodes connected to the first and second conductive type areas, respectively, is not reasonable. As a result, opening voltage and fill factor of the solar cell are improved and efficiency and power of the solar cell can be thus increased. The method for manufacturing a solar cell according to the present embodiment enables formation of the solar cell having a structure in a simple method.

As a result, according to the present embodiment, properties and production efficiency of the solar cell can be improved.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENTS

Figure 1:
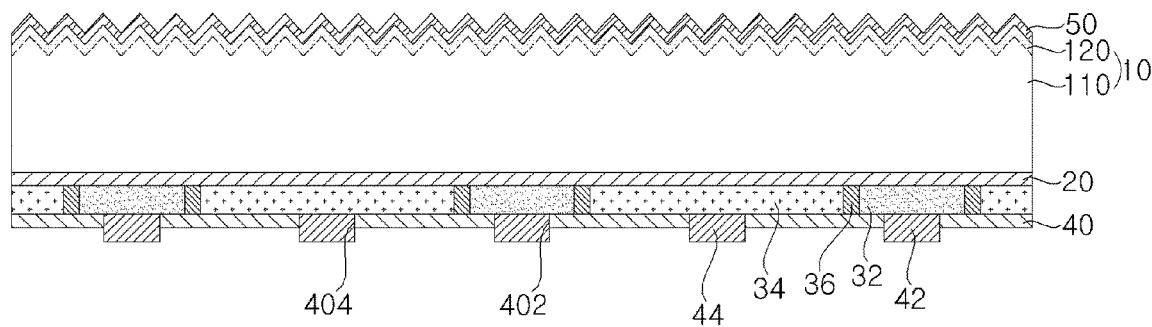
FIG. 1 is a sectional view of a solar cell according to an embodiment of the present invention.

Reference will now be made in detail to the preferred embodiments of the present invention, examples of which are illustrated in the accompanying drawings. The present invention is not limited to the embodiments and the embodiments may be modified into various forms.

In the drawings, parts unrelated to the description may not be illustrated for clear and brief description of the present disclosure, and the same reference numbers may be used throughout the specification to refer to the same or considerably similar parts. In the drawings, the thickness or size may be exaggerated or reduced for more clear description. In addition, the size or area of each constituent element is not limited to that illustrated in the drawings.

It will be further understood that, throughout this specification, when one element is referred to as "comprising" another element, the term "comprising" specifies the presence of another element but does not preclude the presence of other additional elements, unless context clearly indicates otherwise. In addition, it will be understood that when one element such as a layer, a film, a region or a plate is referred to as being "on" another element, the one element may be directly on the another element, and one or more intervening elements may also be present. In contrast, when one element such as a layer, a film, a region or a plate is referred to as being "directly on" another element, one or more intervening elements are not present.

Hereinafter, a solar cell according to an embodiment of the present invention will be described in detail with reference to the annexed drawings.

FIG. 1 is a sectional view of a solar cell according to an embodiment of the present invention.

Referring to FIG. 1, the solar cell 100 according to the present embodiment includes a semiconductor substrate 10, a tunneling layer 20 formed on one surface (for example, back surface) of the semiconductor substrate 10, and a first conductive type area 32, a second conductive type area 34 and a barrier area 36 formed on the tunneling layer 20. In this case, the first conductive type area 32 and the second conductive type area 34 are spaced from each other via the barrier area 36. The solar cell 100 further includes first and second electrodes 42 and 44 which are connected to first and second conductive type areas 32 and 34, respectively, and collect carriers. In addition, an anti-reflective film 50 may be further formed on another surface of the semiconductor substrate 10. This configuration will be described in detail.

The semiconductor substrate 10 may include a base area 110 containing a low doping concentration of first conductive type dopant.

The semiconductor substrate 10 may, for example, include a crystalline semiconductor (for example, crystalline silicon) containing a first conductive-type dopant. The crystalline semiconductor may be monocrystalline silicon, and the first conductive-type dopant may be, for example, an n-type or p-type dopant. That is, the first conductive-type dopant may be an n-type impurity such as a Group V element including phosphorous (P), arsenic (As), bismuth (Bi), antimony (Sb) or the like. Alternatively, the first conductive-type dopant may be a p-type impurity such as a Group III element including boron (B), aluminum (Al), gallium (Ga), indium (In) or the like.

The base area 110 may have an n-type impurity as the first conductive-type dopant. As a result, the second conductive type area 34 forming a tunnel junction through the tunneling layer 20 with the base area 110 may be a p-type. As a result, the first conductive type area 32 serving as an emitter causing photoelectric transformation through junction with the base area 110 may be widely formed and, as a result, holes having movement speed lower than electrons can be efficiently collected. Electrons created by photoelectric effect are collected by a first electrode 42 when light is emitted to the tunnel junction, and holes are moved toward the front surface of the semiconductor substrate 10 and are then collected by a second electrode 44. As a result, electric energy is generated, but the present invention is not limited thereto, and the base area 110 and the first conductive type area 32 may be a p-type while the second conductive type area 34 may be an n-type.

The front surface of the semiconductor substrate 10 is textured to have irregularities having a shape such as a pyramidal shape. When surface roughness is increased due to irregularities formed on the front surface of the semiconductor substrate 10 through such texturing, reflection of light incident through the front surface of the semiconductor substrate 10 can be reduced. Accordingly, an amount of light which reaches the tunnel junction formed by the semiconductor substrate 10 and the second conductive type area 34 is increased and light loss can thus be minimized.

In addition, the back surface of the semiconductor substrate 10 may be a smooth and even surface having a surface roughness lower than the front surface, obtained through mirror polishing or the like. As a result, light which passes through the semiconductor substrate 10 and travels toward the back surface thereof is reflected at the back surface and travels toward the semiconductor substrate again. When tunnel junction is formed through the tunneling layer 20 on the back surface of the semiconductor substrate 10, as in the present embodiment, properties of the solar cell 100 may be greatly changed according to properties of the semiconductor substrate 10. For this reason, irregularities obtained by texturing are not formed on the back surface of the semiconductor substrate 10, but the present invention is not limited thereto and a variety of modifications are possible.

A front surface field layer 120 may be formed on the front surface of the semiconductor substrate 10 (that is, on the base area 110). The front surface field layer 120 is an area where the first conductive-type dopant is doped at a concentration higher than the semiconductor substrate 10 and performs similar functions to a back surface field (BSF) layer. That is, the front surface field layer 120 prevents electrons and holes separated by incident light from being recombined and then decay on the front surface of the semiconductor substrate 10. However, the present invention is not limited to this configuration, and the front surface field layer 120 may be omitted. This example will be described in more detail with reference to FIG. 5.

In addition, an anti-reflective film 50 may be formed on the front surface field layer 120. The anti-reflective film 50 may be entirely formed over the front surface of the semiconductor substrate 10. The anti-reflective film 50 decreases reflectivity of light incident upon the front surface of the semiconductor substrate 10 and passivates defects present on the surface or in the bulk of the front surface field layer 120.

The decrease in reflectivity of light incident upon the front surface of the semiconductor substrate 10 causes an increase in amount of light reaching the tunnel junction. Accordingly, short current (Isc) of the solar cell 100 can be increased. In addition, the anti-reflective film 50 passivates defects, removes recombination sites of minority carriers and thus increases open-circuit voltage (Voc) of the solar cell 100. As such, the anti-reflective film 50 increases open-circuit voltage and short current of the solar cell 100, thus improving conversion efficiency of the solar cell 100.

The anti-reflective film 50 may be formed of a variety of materials. For example, the anti-reflective film 50 may be a single film selected from the group consisting of a silicon nitride film, a silicon nitride film containing hydrogen, a silicon oxide film, a silicon oxide nitride film, $MgF_2$, ZnS, $TiO_2$ and $CeO_2$, or a multilayer film including a combination of two or more thereof, but the present invention is not limited thereto and the anti-reflective film 50 may include a variety of materials.

In the present embodiment, a tunneling layer 20 is formed on the back surface of the semiconductor substrate 10. The tunneling layer 20 improves interface properties of the back surface of the semiconductor substrate 10 and enables produced carriers to be efficiently transferred through tunneling effect. The tunneling layer 20 may include a variety of materials enabling tunneling of carriers and examples of the materials include oxides, nitrides and conductive polymers. The tunneling layer 20 may be entirely formed on the back surface of the semiconductor substrate 10. Accordingly, the tunneling layer 20 entirely passivates the back surface of the semiconductor substrate 10 and can be easily formed without additional patterning.

A thickness of the tunneling layer 20 may be 5.0 nm or less so that the tunneling layer 20 sufficiently exhibits a tunneling effect, or may be 0.5 nm to 5 nm (for example, 1.0 nm to 4 nm). When the thickness of the tunneling layer 20 exceeds 5 nm, tunneling is not efficiently performed and the solar cell 100 may not operate, and when the thickness of the tunneling layer 20 is less than 0.5 nm, there may be difficulty in formation of the tunneling layer 20 with desired qualities. In order to further improve the tunneling effect, the thickness of the tunneling layer 20 may be 1.0 nm to 4.0 nm, but the present invention is not limited thereto and the thickness of the tunneling layer 20 may be changed.

In addition, a first conductive type area 32 having a first conductive type dopant, a second conductive type area 34 having a second conductive type dopant, and a barrier area 36 formed between the first conductive type area 32 and the second conductive type area 34 are formed on the tunneling layer 20.

The first conductive type area 32 may include a semiconductor (for example, silicon) having the same conductive type as the semiconductor substrate 10. The first conductive type area 32 may have a crystalline structure different from the base area 110 so that it is easily formed by a variety of methods such as deposition. For example, the first conductive type area 32 may be easily formed by doping amorphous silicon, microcrystalline silicon, polycrystalline silicon or the like with a first conductive type dopant. The first conductive type dopant may be any dopant having the same conductive type as the semiconductor substrate 10. That is, when the first conductive type dopant is an n-type dopant, a Group V element such as phosphorus (P), arsenic (As), bismuth (Bi) or antimony (Sb) may be used. When the first conductive type dopant is a p-type dopant, a Group III element such as boron (B), aluminum (Al), gallium (Ga) or indium (In) may be used. The first conductive type area 32 forms a back surface field structure and thereby functions to prevent carrier loss through recombination on the surface of the semiconductor substrate 10. In addition, the first conductive type area 32 also functions to reduce contact resistance in a portion thereof contacting the first electrode 42.

The second conductive type area 34 may include a semiconductor (for example, silicon) having a conductive type opposite to the semiconductor substrate 10. The second conductive type area 34 may have a crystalline structure different from the base area 110 so that it is easily formed by a variety of methods such as deposition. For example, the second conductive type area 34 may be easily formed by doping amorphous silicon, microcrystalline silicon, polycrystalline silicon or the like with a second conductive type dopant by a variety of methods such as deposition or printing. In this case, the second conductive type dopant may be any impurity having a conductive type opposite to the semiconductor substrate 10. That is, when the second conductive type dopant is a p-type dopant, a Group III element such as boron (B), aluminum (Al), gallium (Ga) or indium (In) may be used. When the second conductive type dopant is an n-type dopant, a Group V element such as phosphorus (P), arsenic (As), bismuth (Bi) or antimony (Sb) may be used. The second conductive type area 34 forms a tunnel junction with the semiconductor substrate 10 through the tunneling layer 20, thus substantially contributing to photoelectric transformation.

In addition, the barrier area 36 is disposed between the first conductive type area 32 and the second conductive type area 34 and separates the first conductive type area 32 from the second conductive type area 34. When the first conductive type area 32 contacts the second conductive type area 34, shunt is generated and performance of the solar cell 100 is deteriorated. Accordingly, in the present embodiment, the barrier area 36 is interposed between the first conductive type dopant 32 and the second conductive type area 34, thereby preventing unnecessary shunt.

The barrier area 36 may include a variety of materials for substantially insulating the first conductive type area 32 from the second conductive type area 34 and may be between the first and second conductive type areas 32 and 34. The barrier area 36 may be an undoped insulating material (for example, oxide or nitride) or the like. In addition, the barrier area 36 may include an intrinsic semiconductor. In this case, the first and second conductive type areas 32 and 34, and the barrier area 36 are flush with one another and may include an identical semiconductor material (for example, amorphous silicon, microcrystalline silicon or polycrystalline silicon). In this case, a semiconductor layer (represented by reference number "30" in FIG. 3C, the same will be applied below) including a semiconductor material is formed, a portion of the semiconductor layer 30 is doped with a first conductive type dopant to form a first conductive type area 32, another portion of the semiconductor layer 30 is doped with a second conductive type dopant to form a second conductive type area 34, and a portion of the semiconductor layer 30 in which the first and second conductive type areas 32 and 34 are not formed constitutes the barrier area 36, thereby manufacturing the solar cell. That is, the formation methods of the first and second conductive type areas 32 and 34 and the barrier area 36 are simplified. This will be described in more detail in description associated with the manufacturing method later.

However, the present invention is not limited thereto and a variety of modifications are possible. That is, in the drawing, an example in which the barrier area 36 and the first and second conductive type areas 32 and 34 are formed simultaneously and have a substantially identical thickness is given. However, when the barrier area 36 is separately formed with the first and second conductive type areas 32 and 34, that is, the barrier area 36 is formed by patterning or the like, the barrier area 36 may not have the same thickness as the first and second conductive type areas 32 and 34. For example, in order to effectively prevent short of the first and second conductive type areas 32 and 34, the barrier area 36 may have a thickness greater than the first and second conductive type areas 32 and 34. In addition, in order to reduce raw materials for forming the barrier area 36, the thickness of the barrier area 36 may be smaller than that of the first and second conductive type areas 32 and 34. Other modifications are possible.

Here, an area of the second conductive type area 34 having a conductive type different from the base area 110 may be greater than an area of the first conductive type area 32 having the same conductive type as the base area 110. As a result, a tunnel junction formed through the tunneling layer 20 between the semiconductor substrate 110 and the second conductive type area 34 can be widely formed. In addition, as described above, when the base area 110 and the first conductive type area 32 have an n-conductive type and the second conductive type area 34 has a p-conductive type, holes having a low movement speed can be efficiently collected. Plane shapes of the first and second conductive type areas 32 and 34 and the barrier area 36 will be described in more detail with reference to FIG. 2 later.

An insulating layer 40 may be formed on the first and second conductive type areas 32 and 34 and the barrier area 36. The insulating layer 40 prevents undesired connection between the first and second conductive type areas 32 and an improper electrode connection (that is, the second electrode 44 in case of the first conductive type area 32, and the first electrode 42 in case of the second conductive type area 34) and passivates the first and second conductive type areas 32 and 34. The insulating layer 40 includes a first opening 402 exposing the first conductive type area 32 and a second opening 404 exposing the second conductive type area 34.

The insulating layer 40 may have a thickness greater than the tunneling layer 20. As a result, insulating and passivation properties can be improved. The insulating layer 40 may be composed of a variety of insulating materials (for example, oxide or nitride). For example, the insulating layer 40 may have a structure of a single film selected from the group consisting of a silicon nitride film, a silicon nitride film containing hydrogen, a silicon oxide film, a silicon oxide nitride film, $Al_2O_3$, $MgF_2$, ZnS, $TiO_2$ and $CeO_2$, or a structure of a multilayer film including a combination of two or more thereof, but the present invention is not limited thereto and the insulating layer 40 may include a variety of materials.

The first electrode 42 passes through the first opening 402 of the insulating layer 40 and is connected to the first conductive type area 32, and the second electrode 44 passes through the second opening 404 of the insulating layer 40 and is connected to the second conductive type area 34. The first and second electrodes 42 and 44 may include a variety of metal materials. In addition, the first and second electrodes 42 and 44 may have a variety of plane shapes which are not electrically connected to each other and are connected to the first conductive type area 32 and the second conductive type area 34, respectively, to collect produced carriers and transport the same to the outside. That is, the present invention is not limited to the plane shapes of the first and second electrodes 42 and 44.

Figure 2:
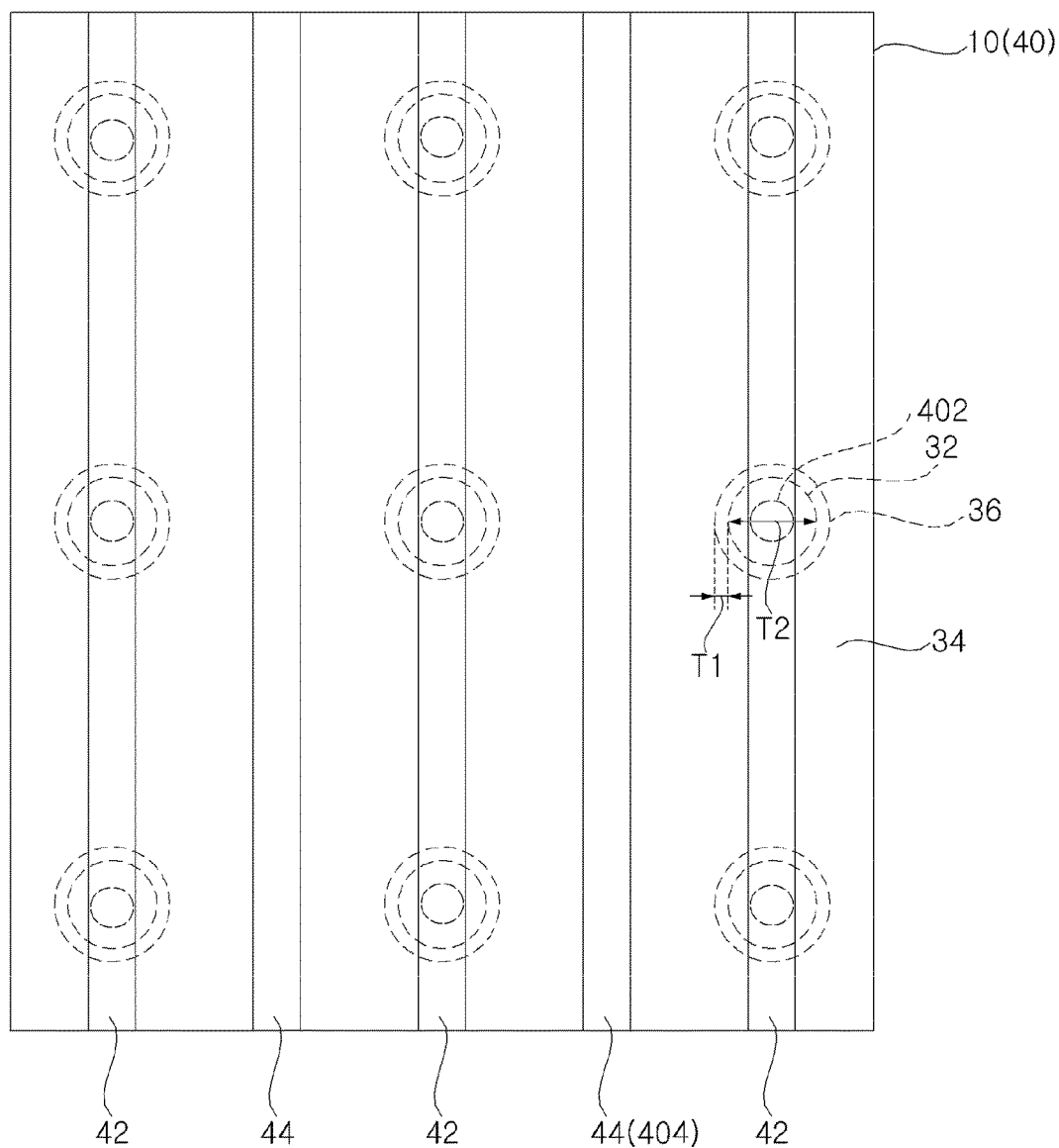
FIG. 2 is a partial back plan view illustrating the solar cell according to the embodiment.

Hereinafter, the plane shapes of the first and second conductive type areas 32 and 34 and the barrier area 36 will be described in detail with reference to FIG. 2. FIG. 2 is a partial back plan view illustrating the solar cell 100 according to the embodiment of the present invention.

Figure 4:
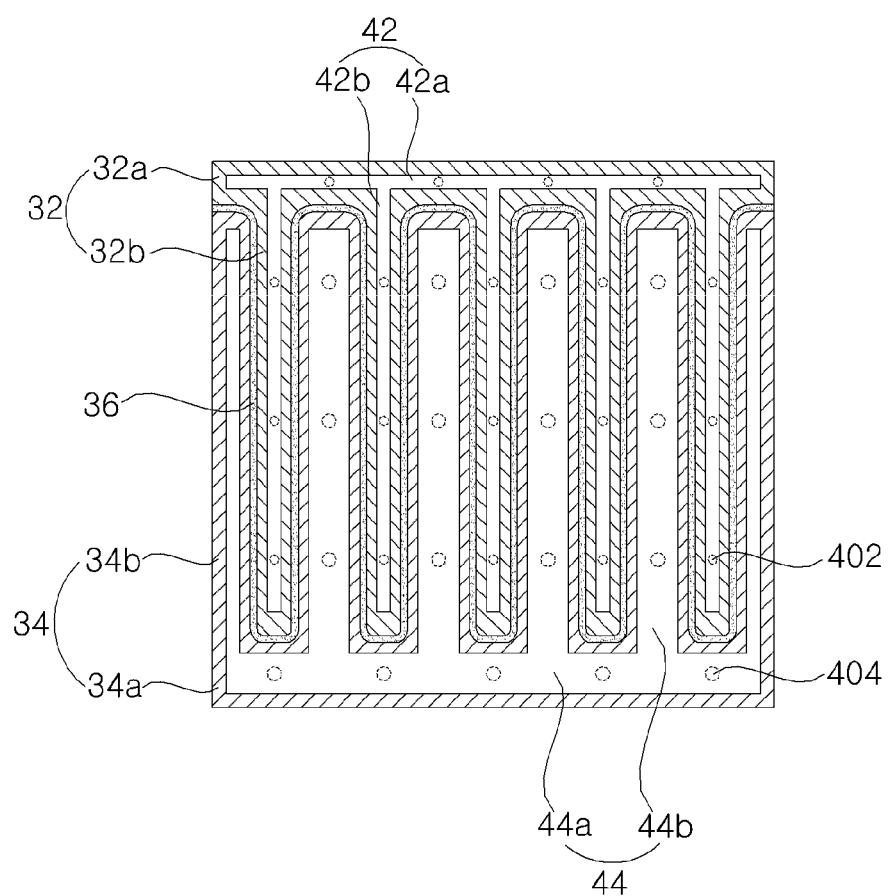
FIG. 4 is a back plan view illustrating a solar cell according to another embodiment of the present invention.

The shapes of the first and second electrodes 42 and 44 shown in FIG. 2 is provided only as an example and the present invention is not limited thereto. That is, as shown in FIG. 2, a plurality of first and second electrodes 42 and 44 are alternately disposed such that the first and second electrodes 42 and 44 are spaced from each other by a predetermined distance. The first electrodes 42 shown in FIG. 2 correspond to branch portions 42a of the first electrode 42 shown in FIG. 4. The second electrodes 44 shown in FIG. 2 correspond to branch portions 44a shown in FIG. 4. Although not separately shown in FIG. 2, as shown in FIG. 4, the first and second electrodes 42 and 44 may further include stem portions 42b and 44b connecting the branch portions 42a and 44a, respectively, at a side. However, as described above, the present invention is not limited thereto and shape, connection configuration or the like of the first and second electrodes 42 and 44 may be varied.

Referring to FIG. 2, as described above, in the solar cell 100 according to the present embodiment, the first conductive type area 32 is formed to have an area smaller than the second conductive type area 34.

For this purpose, in the present embodiment, a plurality of first conductive type areas 32 have an island shape and are spaced from one another. An area of the first conductive type areas 32 are minimized and the first conductive type areas 32 are entirely disposed over the semiconductor substrate 10. The first conductive type area 32 efficiently prevents surface recombination and maximizes an area of the second conductive type area 34, but the present invention is not limited thereto and the first conductive type area 32 may have a variety of shapes capable of minimizing the area of the first conductive type area 32.

In addition, the first conductive type area 32 having a circular shape is exemplarily shown in the drawing, but the present invention is not limited thereto. Accordingly, the first conductive type area 32 may have a plane shape including an oval or a polygon, for example, a triangle, rectangle or hexagon.

A ratio of a total area of the first conductive type area 32 to a total area of the solar cell 100 may be 0.5% to 49% (more preferably 20% to 40%). When the ratio of the total area of the first conductive type area 32 is less than 0.5%, contact between the first conductive type area 32 and the first electrode 42 is not accurately formed and contact resistance between the first conductive type area 32 and the first electrode 42 may thus be increased. When the area ratio exceeds 49%, the area of the second conductive type area 34 is decreased and efficiency of the solar cell 100 is thus deteriorated, as described above. The area ratio is preferably 20% to 40% in consideration of efficiency of the solar cell.

The first conductive type area 32 may be respectively surrounded by the barrier area 36. For example, when the first conductive type area 32 has a circular shape, the barrier area 36 may have a loop or ring shape. That is, the barrier area 36 surrounds the first conductive type area 32 to separate the first conductive type area 32 from the second conductive type area 34 and thereby prevents generation of undesired shunt. The drawing illustrates a case in which the barrier area 36 entirely surrounds the first conductive type area 32 and fundamentally prevents generation of shunt. However, the present invention is not limited thereto and the barrier area 36 may surround only a portion of a periphery of the first conductive type area 32.

In this case, the barrier area 36 is interposed between the first conductive type area 32 and the second conductive type area 34 and functions to separate the first conductive type area 32 from the second conductive type area 34. For this reason, the barrier area 36 has a minimal width, enabling separation between the first and second conductive type areas 32 and 34. That is, a width T1 of the barrier area 36 may be smaller than a width T2 of the first conductive type area 32 having a smaller area. Here, the width T2 of the first conductive type area 32 may be varied according to the shape of the first conductive type area 32. When the first conductive type area 32 has a circular shape as shown in the drawing, the width T2 of the first conductive type area 32 is defined by a diameter and when the first conductive type area 32 has a polygonal shape, the width T2 of the first conductive type area 32 is defined by a long width. As a result, only undesired shunt of the first conductive type area 32 and the second conductive type area 34 can be prevented through a minimal area.

Here, the width T1 of the barrier area 36 may be 0.5 μm to 100 μm. When the width T1 of the barrier area 36 is less than 0.5 μm, the effect of electrically insulating the first and second conductive type areas 32 and 34 may be insufficient and when the width T1 of the barrier area 36 exceeds 100 μm, a ratio of a region (that is, a region corresponding to the barrier area 36) not greatly contributing to photoelectric transformation is increased and efficiency of the solar cell 100 is thus deteriorated. In consideration of insulating effect and efficiency of the solar cell 100, the width T1 of the barrier area 36 may be 1 μm to 30 μm.

For example, a ratio of a total area of the barrier area 36 to a total area of the solar cell 100 may be 0.5% to 5%. When the ratio is less than 0.5%, it may be difficult to form the barrier area 36. When the ratio exceeds 5%, a ratio of a region (that is, a region corresponding to the barrier area 36) not greatly contributing to photoelectric transformation is increased and a ratio of the first and second conductive areas 32 and 34 is decreased. And thus, efficiency of the solar cell 100 may be deteriorated. The width T2 of the first conductive type area 32 may be 50 μm to 1,000 μm. When the width T2 of the first conductive type area 32 is less than 50 μm, electrical connection between the first conductive type area 32 and the first electrode 42 may be not efficiently formed and when the width T2 exceeds 1,000 μm, an area of the second conductive type area 34 is decreased or a distance between the first conductive type areas 32 is increased. In consideration of connection to the first electrode 42, area ratio or the like, the width T2 of the first conductive type area 32 may be 100 μm to 500 μm.

The first and second openings 402 and 404 formed in the insulating layer 40 may be formed to have different shapes in consideration of shapes of the first and second conductive type areas 32 and 34. That is, a plurality of first openings 402 may be spaced from one another while being formed in regions corresponding to the first conductive type areas 32 and the second opening 404 may extend lengthwise. This is based on the configuration that the first electrode 42 is disposed on both the first conductive type area 32 and the second conductive type area 34, while the second electrode 44 is disposed only on the second conductive type area 34. That is, the first opening 402 is formed in a portion of the insulating layer 40 on the first conductive type area 32 and the first opening 402 connects the first electrode 42 to the first conductive type area 32. In addition, the first opening 402 is not formed in a portion of the insulating layer 40 on the second conductive type area 34 to maintain insulation between the first electrode 42 and the second conductive type area 34. Because the second electrode 44 is formed only on the second conductive type area 34, the second opening 404 is formed to have a shape the same as or similar to the second electrode 44 such that the second electrode 44 entirely contacts the second conductive type area 34.

As described above, the solar cell 100 according to the present embodiment includes the barrier area 36 interposed between the first conductive type area 32 and the second conductive type area 34 disposed on one surface (for example, back surface) of the semiconductor substrate 10. As a result, shunt caused by undesired short between the first conductive type area 32 and the second conductive type area 34 can be prevented. In addition, the barrier area 36 prevents connection between the first and second conductive type areas 32 and 34 and undesired impurity layers, when alignment of the first and second electrodes 42 and 44 connected to the first and second conductive type areas 32 and 34, respectively, is not reasonable. As a result, opening voltage and fill factor of the solar cell 100 are improved, and efficiency and power of the solar cell 100 can be thus increased.

In the present embodiment, the first and second conductive type areas 32 and 34 and the barrier area 36 are simultaneously formed in a single process, thereby obtaining the solar cell 100 with an improved structure through a simple process. This will be described in more detail with reference to FIGS. 3A to 3K. Hereinafter, details of the description given above may not be mentioned and only the difference from the description above may be described in detail.

FIGS. 3A to 3K are sectional views illustrating a method for manufacturing the solar cell according to an embodiment of the present invention.

Figure 3A:
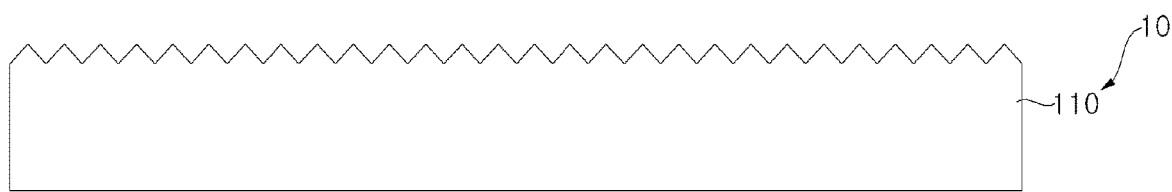
FIGS. 3A to 3K are sectional views illustrating a method for manufacturing a solar cell according to an embodiment of the present invention.

First, as shown in FIG. 3A, a semiconductor substrate 10 including a base area 110 having a first conductive-type dopant is prepared during preparation of the substrate. In the present embodiment, the semiconductor substrate 10 may include silicon having an n-type impurity. Examples of the n-type impurity include Group V elements such as phosphorous (P), arsenic (As), bismuth (Bi) and antimony (Sb).

The front surface of the semiconductor substrate 10 is textured so that the front surface has irregularities and the back surface of the semiconductor substrate 10 is subjected to treatment such as mirror polishing so that the back surface of the semiconductor substrate 10 has a lower surface roughness than the front surface thereof.

Wet or dry texturing may be used as the texturing of the front surface of the semiconductor substrate 10. Wet texturing may be carried out by dipping the semiconductor substrate 10 in a texturing solution and has an advantage of short process time. Dry texturing is a process of cutting the surface of the semiconductor substrate 10 using a diamond drill, laser or the like and enables formation of uniform irregularities, but disadvantageously has long process time and may cause damage to the semiconductor substrate 10. Alternatively, the semiconductor substrate may be textured by reactive ion etching (RIE) or the like. As such, the semiconductor substrate 10 may be textured by a variety of methods. In addition, the back surface of the semiconductor substrate 10 may be treated by a known mirror surface polishing method.

Figure 3B:
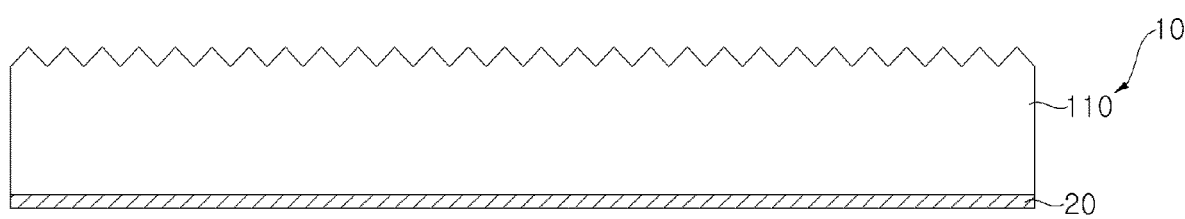

Next, as shown in FIG. 3B, a tunneling layer 20 is formed on the back surface of the semiconductor substrate 10. The tunneling layer 20 may be formed by a method such as thermal growth or deposition (for example, plasma-enhanced chemical vapor deposition chemical (PECVD), atomic layer deposition (ALD)) or the like, but the present invention is not limited thereto and the tunneling layer 20 may be formed by a variety of methods.

Figure 3C:
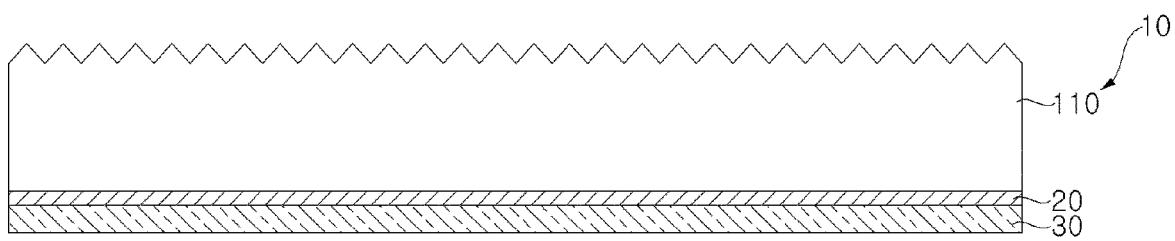

Next, as shown in FIG. 3C, a semiconductor layer 30 is formed on the tunneling layer 20. The semiconductor layer 30 includes a microcrystalline, amorphous or polycrystalline semiconductor. The semiconductor layer 30 may be formed by a method, for example, thermal growth, deposition (for example, plasma-enhanced chemical vapor deposition chemical (PECVD)) or the like, but the present invention is not limited thereto and the semiconductor layer 30 may be formed by a variety of methods.

Next, as shown in FIGS. 3D to 3G, a plurality of first conductive type areas 32, a plurality of second conductive type areas 34 and a plurality of barrier areas 36 are formed on the semiconductor layer 30. This will be described in more detail.

Figure 3D:
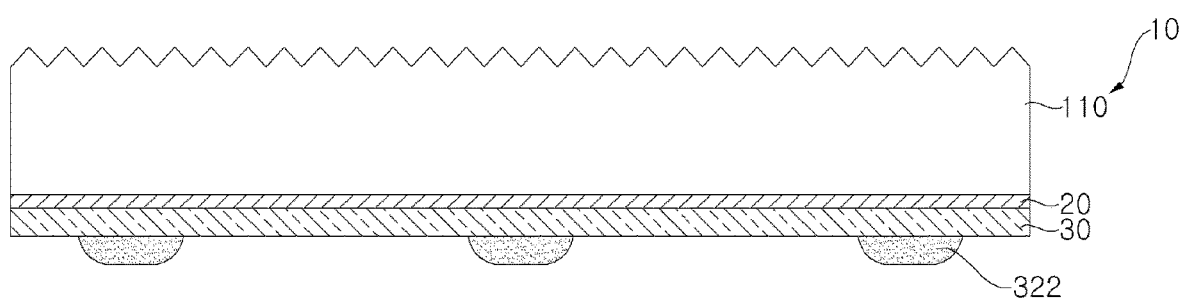

That is, as shown in FIG. 3D, a first doping layer 322 is formed in regions corresponding to the first conductive type areas 32. The first doping layer 322 may include various layers including a first conductive type dopant and may be phosphorous silicate glass (PSG). The first doping layer 322 can be easily formed using phosphorous silicate glass (PSG). The first doping layer 322 may include a plurality of doping portions corresponding to the first conductive type areas 32. The doping portions may have island shapes corresponding to the second conductive type areas 32.

The first doping layer 322 may be formed to have a shape corresponding to the first conductive type area 32 on the semiconductor layer 30 using a mask. Alternatively, the first doping layer 322 may be formed to have a shape corresponding to the first conductive type area 32 on the semiconductor layer 30 by a method such as ink-jetting or screen printing. Alternatively, the first doping layer 322 may be formed by entirely forming a material for forming the first doping layer 322 on the semiconductor layer 30, and removing regions where the first conductive type areas are not formed using an etching solution, an etching paste or the like.

Figure 3E:
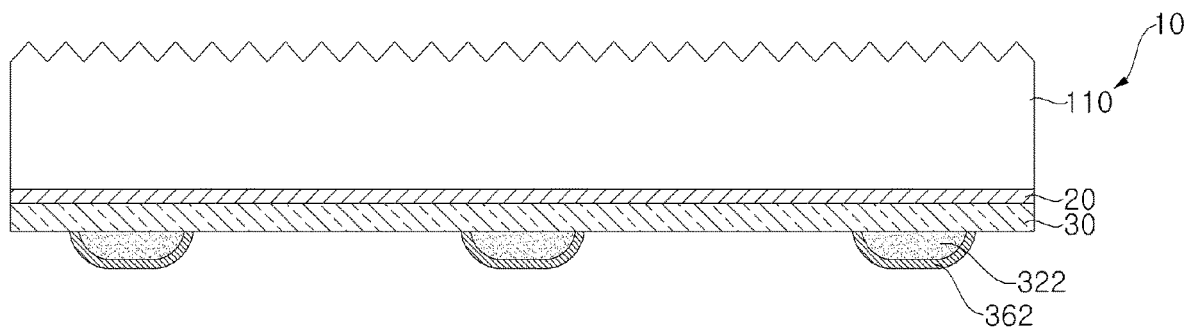

Next, as shown in FIG. 3E, an undoped layer 362 is formed such that the undoped layer 362 covers the first doping layer 322 and a portion of the semiconductor layer adjacent thereto. The undoped layer 362 includes a material not including the first and second conductive type areas. For example, the undoped layer 362 may include silicate or an insulating film. The undoped layer 362 may include a plurality of portions respectively corresponding to the doping portions of the first doping layer 322 and covering areas greater than the doping portions of the first doping layer 322.

The undoped layer 362 may be formed to have a desired shape using a mask on the semiconductor layer 30. Alternatively, the undoped layer 362 may be formed on the semiconductor layer 30 by a method such as ink-jetting or screen printing. Alternatively, the undoped layer 362 may be formed by entirely forming a material for forming the undoped layer 362 over the first doping layer 322 and the semiconductor layer 30, and removing undesired regions using an etching solution, an etching paste or the like.

Figure 3F:
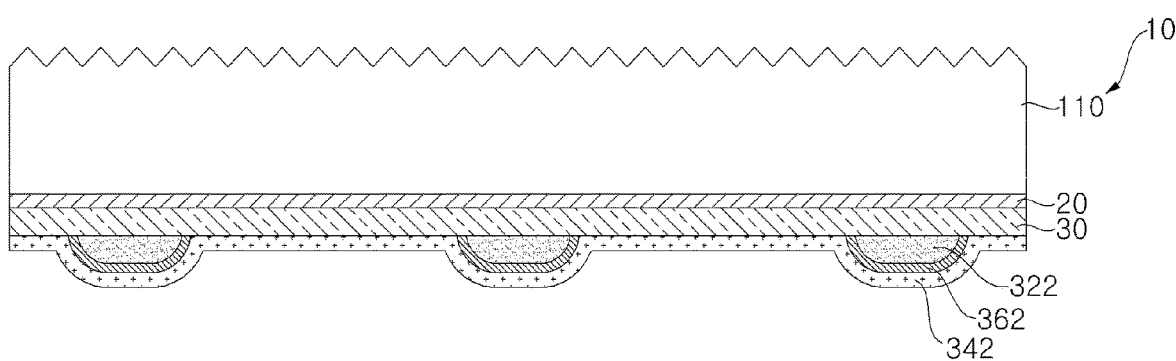

Next, as shown in FIG. 3F, a second doping layer 342 are formed on the undoped layer 362 and the semiconductor layer 30. The second doping layer 342 may include a variety of layers including a second conductive type dopant and may be boron silicate glass (BSG). The second doping layer 342 can be easily formed using boron silicate glass. The second doping layer 342 may be entirely formed to cover the undoped layer 362 and the semiconductor layer 30.

Figure 3G:
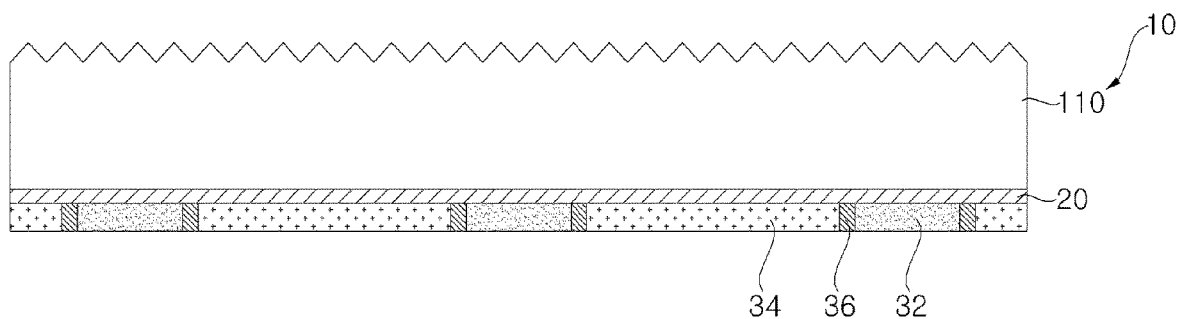

Next, as shown in FIG. 3G, the first conductive type dopant in the first doping layer 322 is diffused into the semiconductor layer 30 by thermal treatment to form a plurality of first conductive type areas 32, and the second conductive type dopant in the second doping layer 342 is diffused into the semiconductor layer 30 to form a plurality of second conductive type areas 34. Portions adjacent to the undoped layer 362 and interposed between the first conductive type area 32 and the second conductive type area 34 are not doped and the semiconductor layer 30 remains unremoved to constitute a plurality of barrier areas 36. As a result, each barrier area 36 is interposed between the first conductive type area 32 and the second conductive type area 34, while separating the first conductive type area 32 from the second conductive type area 34.

The first doping layer 322, the undoped layer 362 and the second doping layer 342 are removed. The removal may be carried out using well-known various methods. For example, the first doping layer 322, the undoped layer 362 and the second doping layer 342 are removed by immersing in diluted HF and then cleaning with water, but the present invention is not limited thereto.

Figure 3H:
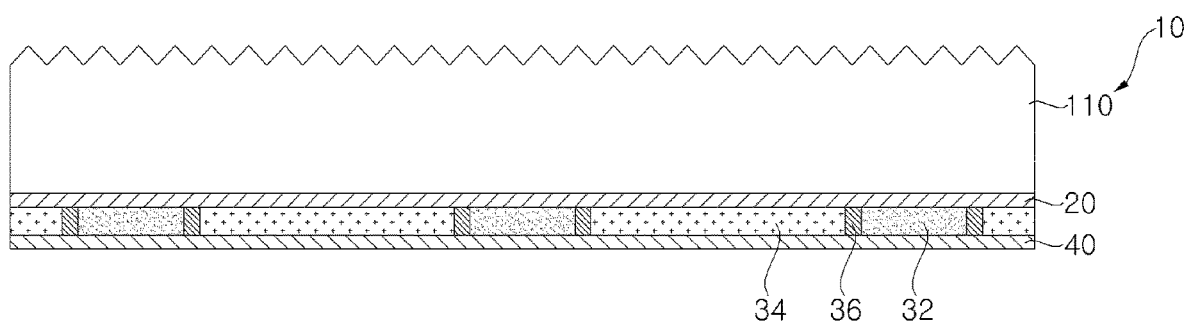

Next, as shown in FIG. 3H, an insulating layer 40 is formed on the first and second conductive type areas 32 and 34 and the barrier area 36. The insulating layer 40 may be formed by a variety of methods such as vacuum deposition, chemical vapor deposition, spin coating, screen printing or spray coating, but the present invention is not limited thereto and various methods may be used.

Figure 3I:
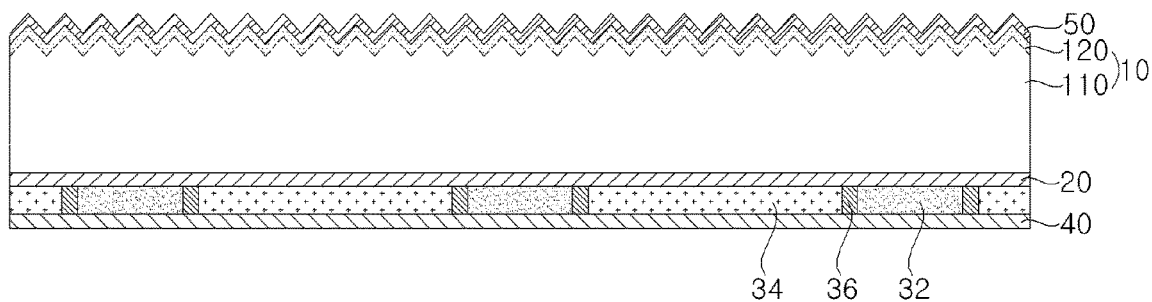

Next, as shown in FIG. 3I, a front surface field layer 120 and an anti-reflective film 50 are formed on the front surface of the semiconductor substrate 10.

The front surface field layer 120 may be formed by doping a first conductive type dopant. For example, the front surface field layer 120 may be formed by doping the semiconductor substrate 10 with a first conductive type dopant by a variety of methods such as ion implantation or thermal diffusion.

The anti-reflective film 50 may be formed by a variety of methods such as vacuum deposition, chemical vapor deposition, spin coating, screen printing or spray coating.

Figure 3J:
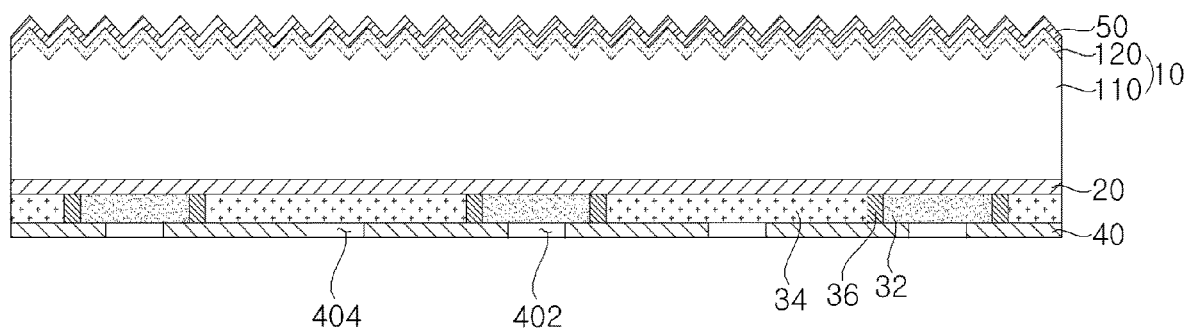
Figure 3K:
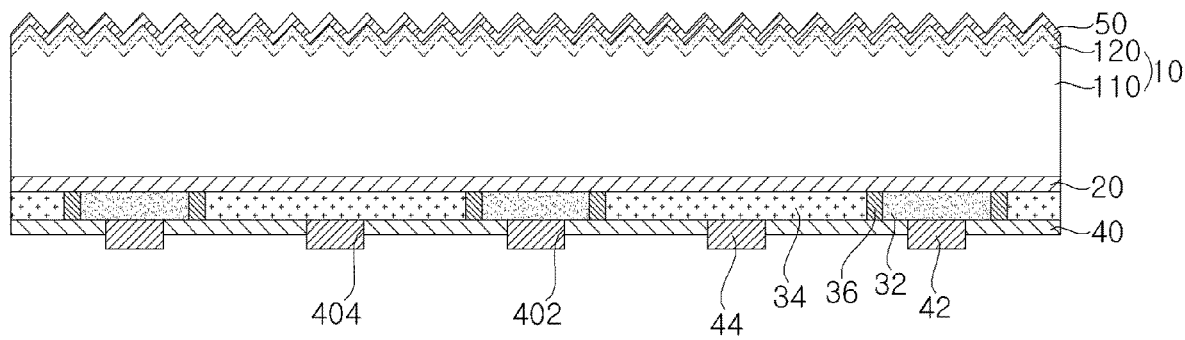

Next, as shown in FIG. 3J, openings 402 and 404 exposing the first and second conductive type areas 32 and are formed and as shown in FIG. 3K, first and second electrodes 42 and 44 electrically connected to the first and second conductive type areas 32 and 34, respectively, are formed. In this case, for example, the first and second electrodes 42 and 44 may be formed in the opening by a variety of methods such as coating or deposition.

In another embodiment, the first and second electrodes 42 and 44 may be formed by applying a paste for forming the first electrode onto the insulating layer 40 by screen printing or the like and then performing fire through, laser firing contact or the like thereon. In this case, because the openings 402 and 404 are formed during formation of the first and second electrodes 42 and 44, a process (process of FIG. 3J) of separately forming openings 402 and 404 is not required.

According to the present embodiment, the first and second conductive type areas 32 and 34 and the barrier area 36 are simultaneously formed by a simple process including forming the semiconductor layer 30 and then doping a portion thereof with an impurity, thereby simplifying manufacturing method of the solar cell 100 and improving production efficiency. In particular, the first doping layer 322 and the undoped layer 362, each including a plurality of portions, are formed and the second doping layer 342 is then formed over the entire surface including the resulting structure, thereby minimizing the number of patterning operations and simultaneously forming the first and second conductive type areas 32 and 34 and the barrier area 36. Accordingly, production efficiency can be greatly improved.

Unlike the present embodiment, when the first and second conductive type areas are separated by etching portions between the first and second conductive type areas, a portion of the semiconductor substrate is etched and is thus exposed to the outside. As a result, the semiconductor substrate is damaged and properties of solar cell are deteriorated. In order to prevent these problems, an additional passivation layer should be formed in a portion of the semiconductor substrate exposed to the outside. As a result, qualities and production efficiency of solar cells are deteriorated.

A example in which the tunneling layer 20, the first and second conductive type areas 32 and 34, the barrier area 36 and the insulating layer 40 are formed, the front surface field layer 120 and anti-reflective film 50 are formed, and the first and second electrodes 42 and 44 are formed is given in the embodiment described above, but the present invention is not limited thereto. Accordingly, a formation order of the tunneling layer 20, the first and second conductive type areas 32 and 34, the barrier area 34, the insulating layer 40, the front surface field layer 120, the anti-reflective film 50, and the first and second electrodes 42 and 44 may be varied.

In addition, an example, in which the first doping layer 322 is formed, and the undoped layer 362 and the second doping layer 342 are then formed, is given in the embodiment described above, but the present invention is not limited thereto. That is, the undoped layer 362 and the first doping layer 322 may be sequentially formed after the second doping layer 342 is formed. The first and second doping layers 322 and 342 may be formed after the undoped layer 362 is formed only a region corresponding to the barrier area 36. Accordingly, formation order of the first and second doping layers 322 and 342 and the undoped layer 362 may be varied.

Hereinafter, a method for manufacturing the solar cell according to another embodiment will be described in more detail with reference to FIGS. 4 and 5. Details of contents the same as or similar to the description given above may not be mentioned and only the difference from the description above may be described in detail.

FIG. 4 is a back surface plan view illustrating a solar cell according to another embodiment of the present invention. For clear and brief illustration, the insulating layer 40 is not shown in FIG. 4.

Referring to FIG. 4, in the present embodiment, the first conductive type area 32 may include a first stem portion 32a formed along a first edge (upper edge in the drawing) of the semiconductor substrate 10 and a plurality of first branch portions 32b which extend from the first stem portion 32a toward a second edge (lower edge in the drawing) opposite to the first edge. The plurality of first branch portions 32b are aligned to be parallel to each other to have a shape of a stripe pattern. The second conductive type area 34 may include a second stem portion 34a formed along the second edge of the semiconductor substrate 110 and a plurality of second branch portions 32b which extend between the first branch portions 32b toward the first edge from the second stem portion 34a. The plurality of second branch portions 34b are aligned to be parallel to each other to have a shape of a stripe pattern. The first branch portions 32b of the first conductive type area 32 and the second branch portions 34b of the second conductive type area 34 may be alternately disposed. Though this configuration, a junction area can be increased and carriers can be entirely collected. In addition, the barrier area 36 may be formed between the first conductive type area 32 and the second conductive type area 34.

As described above, an area of the first conductive type area 32 may be smaller than an area of the second conductive type area 34. For example, the area of the first and second conductive type areas 32 and 34 can be controlled by changing the first and second stem portions 32a and 34a and/or the first and second branch portions 32b and 34b of the first and second conductive type areas 32 and 34.

The first electrode 42 includes a stem portion 42a formed in a region corresponding to the first stem portion 32a of the first conductive type area 32, and a branch portion 42b formed in a region corresponding to the branch portion 32b of the first conductive type area 32. Similarly, the second electrode 44 may include a stem portion 44a in a region corresponding to the second stem portion 34a of the second conductive type area 34, and a branch portion 44b formed in a region corresponding to the branch portion 34b of the second conductive type area 34, but the present invention is not limited thereto and the first electrode 42 and the second electrode 44 may have a variety of plane shapes.

In the embodiment, it is exemplified that the first conductive type area has the first stem portion 32a, the second conductive type area has the second stem portion 34a, the first electrode 42 has the stem portion 42a, and the second electrode 44 has the stem portion 44a. However, the present invention is not limited thereto, and the first and second stem portions 32a and 34a, and the stem portions 42a and 44a are not necessary. Therefore, the first and/or second stem portions 32a and 34a, and/or the stem portions 42a and 44a may be not formed or may be not included. In this case, each of the first and second conductive type areas 32 and 34 consisting of the first and second branch portions 32b and 34b has a stripe pattern, and the barrier area 36 has a shape of a stripe pattern between the branch portion 32b of the first conductive type area 32 and the branch portion 32b of the second conductive type area 34.

For example, a ratio of a total area of the first conductive type area 32 to a total area of the solar cell 100 may be 0.5% to 49% (more preferably 20% to 40%). When the ratio of the total area of the first conductive type area 32 is less than 0.5%, contact between the first conductive type area 32 and the first electrode 42 is not accurately formed and contact resistance between the first conductive type area 32 and the first electrode 42 may thus be increased. When the area ratio exceeds 49%, the area of the first conductive type area 32 is decreased and efficiency of the solar cell 100 is thus deteriorated, as described above. The area ratio is preferably 20% to 40% in consideration of efficiency of the solar cell.

The width of each of the first branch portions 32b having the stripe pattern may be 50 μm to 1,000 μm. When the width of the first branch portions 32b is less than 50 μm, electrical connection between the first conductive type area 32 and the first electrode 42 may be not efficiently formed. When the width exceeds 1,000 μm, an area of the second conductive type area 34 is decreased or a distance between the first conductive type areas 32 is increased. In consideration of connection to the first electrode 42, area ratio or the like, the width of each of the first branch portions 32b 32 may be 100 μm to 500 μm.

When the first branch portions 32b has the stripe pattern, the first branch portions 32b can be stably connected to the first electrode 42, compared with the first conductive type having a dot shape shown in FIG. 2.

Figure 5:
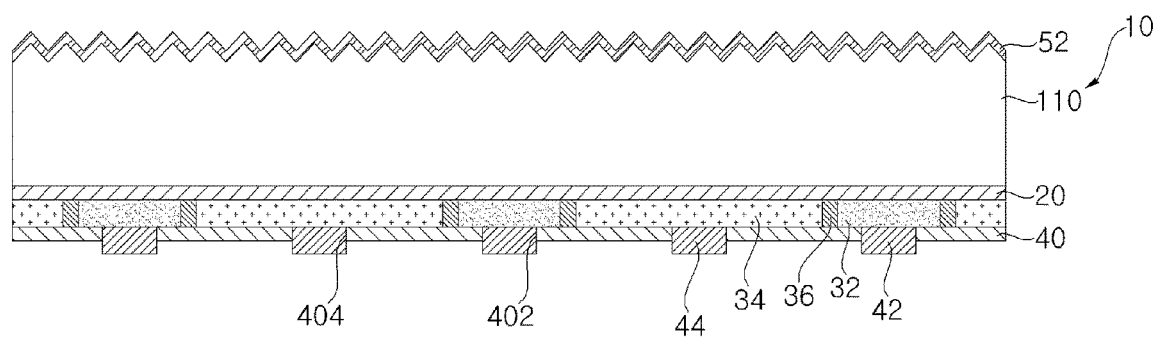
FIG. 5 is a sectional view illustrating a solar cell according to another embodiment of the present invention.

FIG. 5 is a sectional view illustrating a solar cell according to another embodiment of the present invention.

Referring to FIG. 5, in the solar cell according to the embodiment, the semiconductor substrate 10 includes only the base area 110 and does not include an additional front surface field layer (represented by reference numeral "120" in FIG. 1, the same will be applied below). Instead, a field effect-forming layer 52 which contacts the base area 110 of the semiconductor substrate 10 and has a fixed charge is formed. Similar to the front surface field layer 112, the field effect-forming layer 52 generates a certain field effect and thereby prevents surface recombination. The field effect-forming layer 52 may be composed of aluminum oxide having a negative charge, or silicon oxide or silicon nitride having a positive charge or the like. Although not additionally shown, an additional anti-reflective film (represented by reference numeral "50" in FIG. 1) may be further formed on the field effect-forming layer 52.

As such, in the present embodiment, the semiconductor substrate 10 does not include an additional doping area and includes only a base area 110. As a result, a process of forming the additional doping area is eliminated and the overall process is thus simplified. During doping to form the additional doping area, deterioration in properties of the solar cell 100 caused by damage to the semiconductor substrate 10 can be prevented.

Here, an amount of fixed charges of the field effect-forming layer 52 is for example $1 \times 10^{12}/cm^2$ to $9 \times 10^{13}/cm^2$. The amount of the fixed charges is a level enabling generation of the field effect in the semiconductor substrate 10 not including the doping area. More specifically, in consideration of the field effect, the amount of fixed charges may be $1 \times 10^{12}/cm^2$ to $1 \times 10^{13}/cm^2$, but the present invention is not limited thereto and the amount of fixed charges may be varied.

In this case, the base area 110 not including the doping area may have a specific resistance of 0.5 ohm·cm to 20 ohm·cm (for example, 1 ohm·cm to 15 ohm·cm). Accordingly, in a region adjacent to the field effect-forming layer 52, the semiconductor substrate 10 may have a specific resistance of 0.5 ohm·cm to 20 ohm·cm (for example, 1 ohm·cm to 15 ohm·cm). However, this specific resistance range is given as an example of a case when the semiconductor substrate 10 includes an n-type base area 110 using phosphorous (P) as an impurity and may be changed according to conductive type, impurity type or the like.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing a solar cell comprising:
forming a tunneling layer entirely on a first surface of a semiconductor substrate;
forming a first conductive type area and a second conductive type area on the tunneling layer,
wherein the first conductive type area and the second type area are deposited directly on the tunneling layer;
separately forming a barrier area to separate the first conductive type area and the second conductive type area;
forming a front surface field layer having a conductive type the same as the base area and having a high doping concentration higher than the base area on a second surface of the semiconductor substrate;
forming a passivation layer formed on the first and second conductive type areas and the barrier area;
forming a first electrode connected to the first conductive type area by penetrating a first contact hole of the passivation layer and a second electrode connected to the second conductive type area by penetrating a second contact hole of the passivation layer,
wherein the first conductive type area comprises amorphous silicon, microcrystalline silicon, or polycrystalline silicon including the first conductive type dopant,
wherein the second conductive type area comprises amorphous silicon, microcrystalline silicon, or polycrystalline silicon including the second conductive type dopant;
wherein the barrier area comprises amorphous silicon, microcrystalline silicon, or polycrystalline silicon being intrinsic,
wherein the first conductivity type area and the second conductivity type area have a continuously uniform thickness, and the barrier layer also has a continuously uniform thickness, and
the barrier area has the thickness greater than the thickness of the first and second conductive areas.

2. The method according to claim 1, wherein the doping comprises:
forming a first doping layer including the first conductive type dopant on the semiconductor layer;
forming an undoped layer on the first doping layer and on a portion of the semiconductor layer adjacent to the first doping layer;
forming a second doping layer including the second conductive type dopant over the entire undoped layer and the semiconductor layer; and
diffusing the first conductive type dopant and the second conductive type dopant into the semiconductor layer to simultaneously form a first conductive type area and a second conductive type area,
wherein, after the diffusing, a portion of the semiconductor layer into which the first conductive type dopant is diffused constitutes the first conductive type area, and a portion of the semiconductor layer into which the second conductive type dopant is diffused constitutes the second conductive type area.

3. The method according to claim 2, wherein one of the first doping layer and the second doping layer comprises boron silicate glass (BSG) and the other of the first doping layer and the second doping layer comprises phosphorous silicate glass (PSG).

* * * * *